(12) United States Patent  
Honjou et al.

(10) Patent No.: US 9,406,869 B2  
(45) Date of Patent: Aug. 2, 2016

(54) SEMICONDUCTOR DEVICE

(71) Applicants: NEC CORPORATION, Tokyo (JP); TOHOKU UNIVERSITY, Sendai-shi, Miyagi (JP)

(72) Inventors: Hiroaki Honjou, Tokyo (JP); Keizo Kinoshita, Sendai (JP); Hideo Ohno, Sendai (JP)

(73) Assignees: NEC CORPORATION, Tokyo (JP); TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 14/409,886

(22) PCT Filed: Apr. 24, 2013

(86) PCT No.: PCT/JP2013/062734  
§ 371 (c)(1),  
(2) Date: Dec. 19, 2014

(87) PCT Pub. No.: WO2013/190924  
PCT Pub. Date: Dec. 27, 2013

(65) Prior Publication Data  
US 2015/0200354 A1   Jul. 16, 2015

(30) Foreign Application Priority Data  
Jun. 21, 2012   (JP) ................. 2012-139559

(51) Int. Cl.  
*H01L 43/02*   (2006.01)  
*H01L 43/08*   (2006.01)  
(Continued)

(52) U.S. Cl.  
CPC ............... *H01L 43/02* (2013.01); *H01L 43/08* (2013.01); *H01L 43/10* (2013.01); *H01L 43/12* (2013.01)

(58) Field of Classification Search  
USPC ......................................................... 257/421  
See application file for complete search history.

(56) References Cited

U.S. PATENT DOCUMENTS

| 6,759,138 | B2 * | 7/2004 | Tomiyasu | G11B 5/012 |
| | | | | 428/141 |
| 2002/0048226 | A1 * | 4/2002 | Kawaguchi | G11B 11/10515 |
| | | | | 369/13.08 |

(Continued)

FOREIGN PATENT DOCUMENTS

| JP | 6-244150 A | 9/1994 |
| JP | 2009-526372 A | 7/2009 |

(Continued)

OTHER PUBLICATIONS

H. Honjo, et al., "Domain-wall-motion cell with perpendicular anisotropy wire and in-plane magnetic tunneling junctions", Journal of Applied Physics, 2012, pp. 07C903-0-07C903-3, vol. 111.

(Continued)

*Primary Examiner* — Thao P Le  
(74) *Attorney, Agent, or Firm* — Sughrue Mion, PLLC

(57) ABSTRACT

A semiconductor device includes: a first magnetic layer (1) disposed on a flat substrate surface; a second magnetic layer (3) disposed above the first magnetic layer (1) and magnetically coupled to the first magnetic layer (1) by magnetostatic coupling or exchange coupling; and a third thin film layer (8) formed between the first magnetic layer (1) and the second magnetic layer (3), the third thin film layer (8) having such a thickness as to avoid inhibiting the magnetic coupling between the first magnetic layer (1) and the second magnetic layer (3).

9 Claims, 17 Drawing Sheets

(51) Int. Cl.
*H01L 43/12* (2006.01)
*H01L 43/10* (2006.01)

(56) References Cited

U.S. PATENT DOCUMENTS

| | | | | |
|---|---|---|---|---|
| 2003/0133233 | A1* | 7/2003 | Gill | B82Y 10/00 |
| | | | | 360/324.12 |
| 2004/0086751 | A1* | 5/2004 | Hasegawa | B82Y 10/00 |
| | | | | 428/815 |
| 2007/0097742 | A1* | 5/2007 | Fujiwara | G11C 11/16 |
| | | | | 365/171 |
| 2013/0234268 | A1* | 9/2013 | Kariyada | H01L 43/08 |
| | | | | 257/421 |

FOREIGN PATENT DOCUMENTS

| | | |
|---|---|---|
| JP | 2009-181615 A | 8/2009 |
| WO | 2007/015355 A1 | 2/2007 |
| WO | 2009/122990 A1 | 10/2009 |
| WO | 2011/030529 A1 | 3/2011 |

OTHER PUBLICATIONS

International Search Report of PCT/JP2013/062734, dated Jun. 4, 2013. [PCT/ISA/210].

\* cited by examiner

| GAS FLOW RATE | AMMONIA/CARBON MONOXIDE=75/25 sccm |
|---|---|
| GAS PRESSURE | 1.3 pascals |
| DISCHARGE POWER | 800 watts |
| SUBSTRATE BIAS POWER | 300 watts |
| SUBSTRATE TEMPERATURE | 75 degrees |

FIG. 6

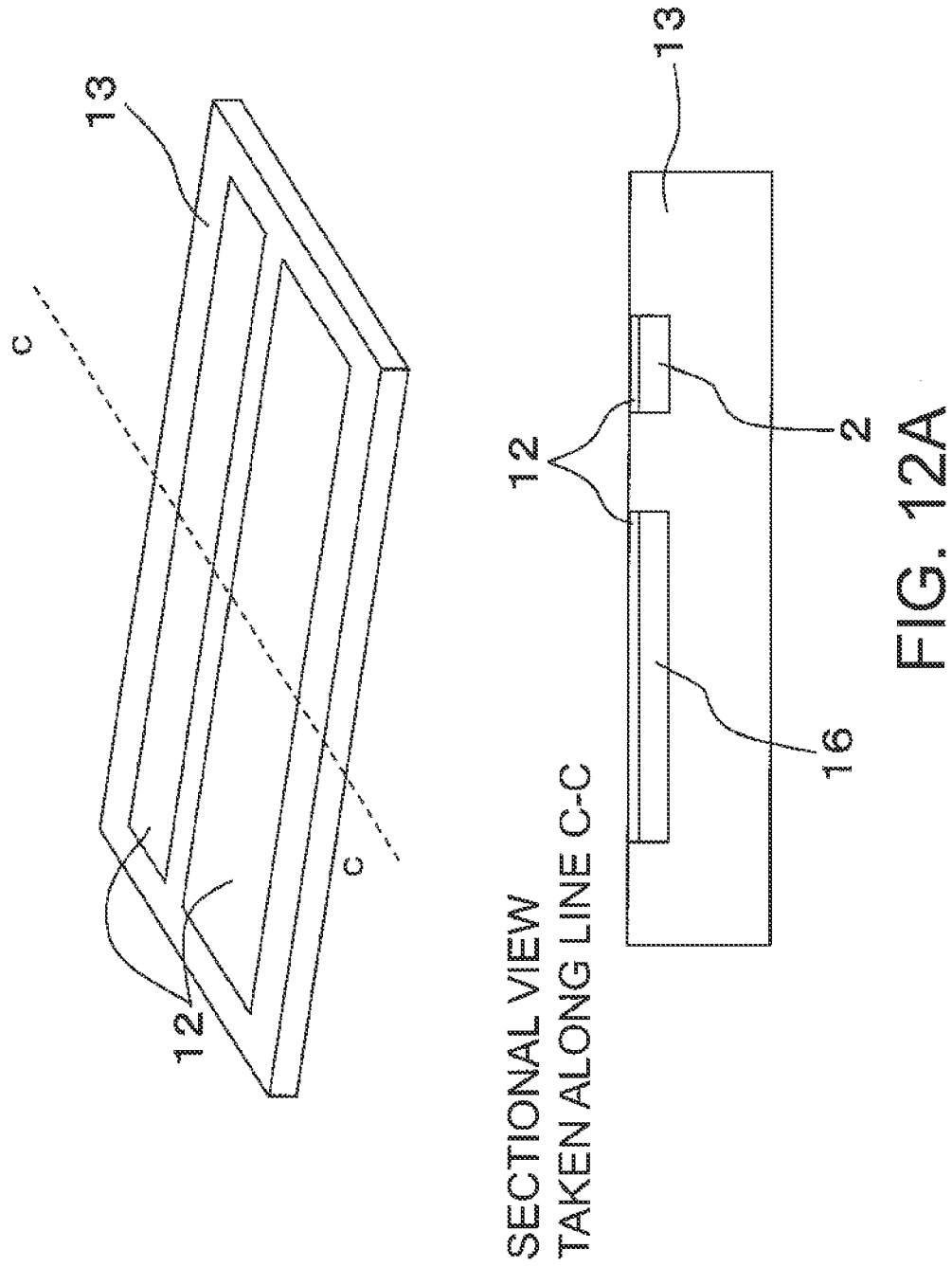

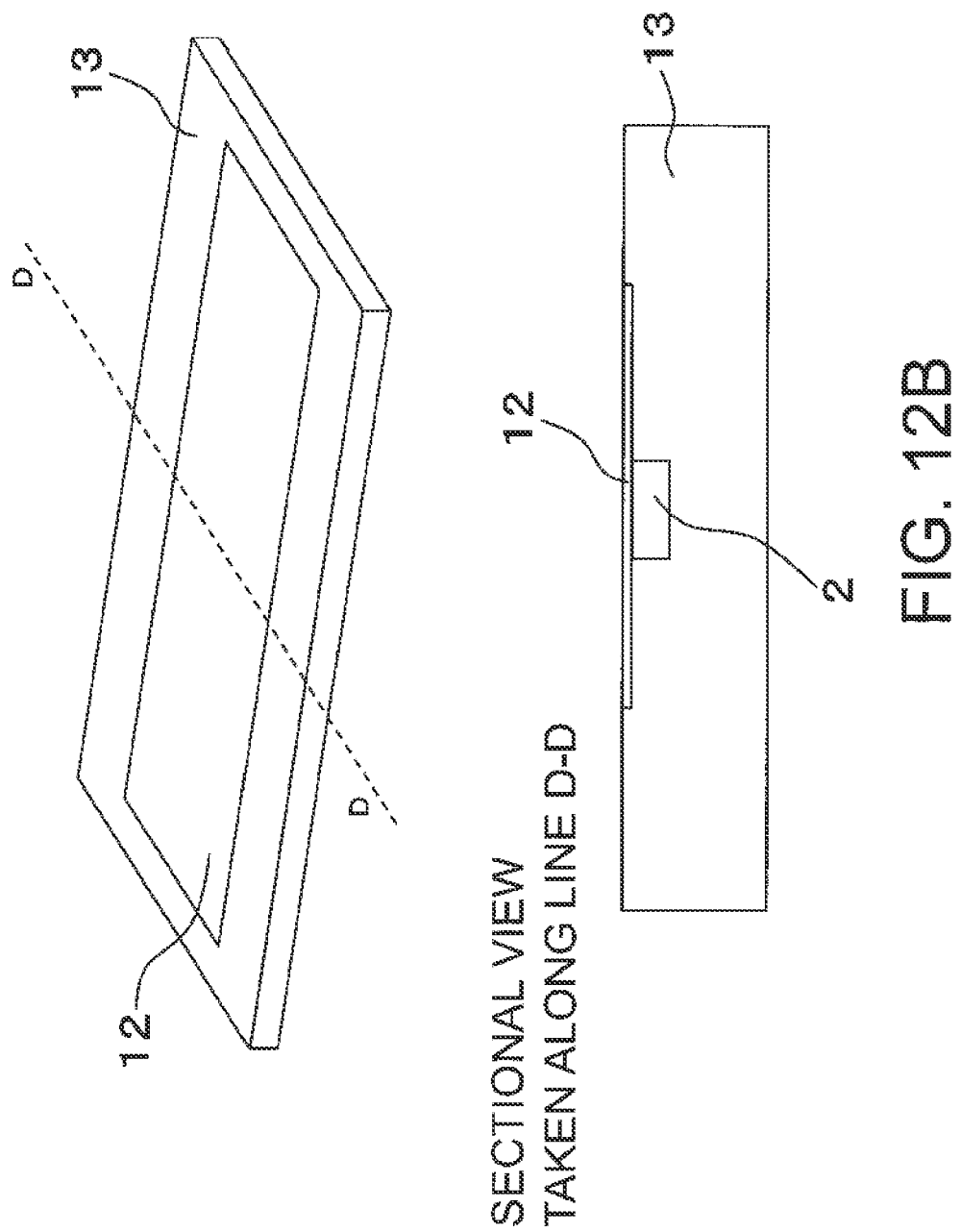

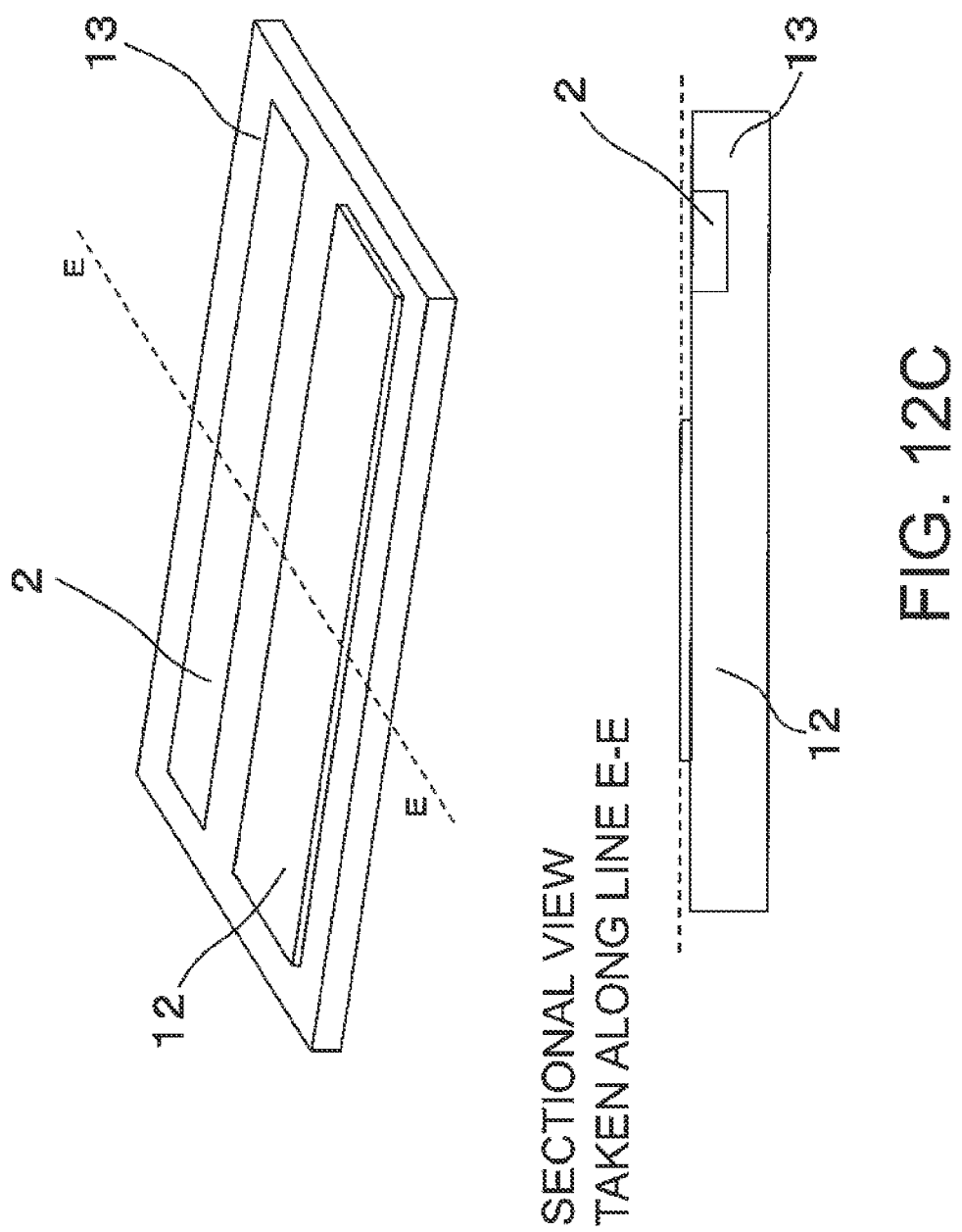

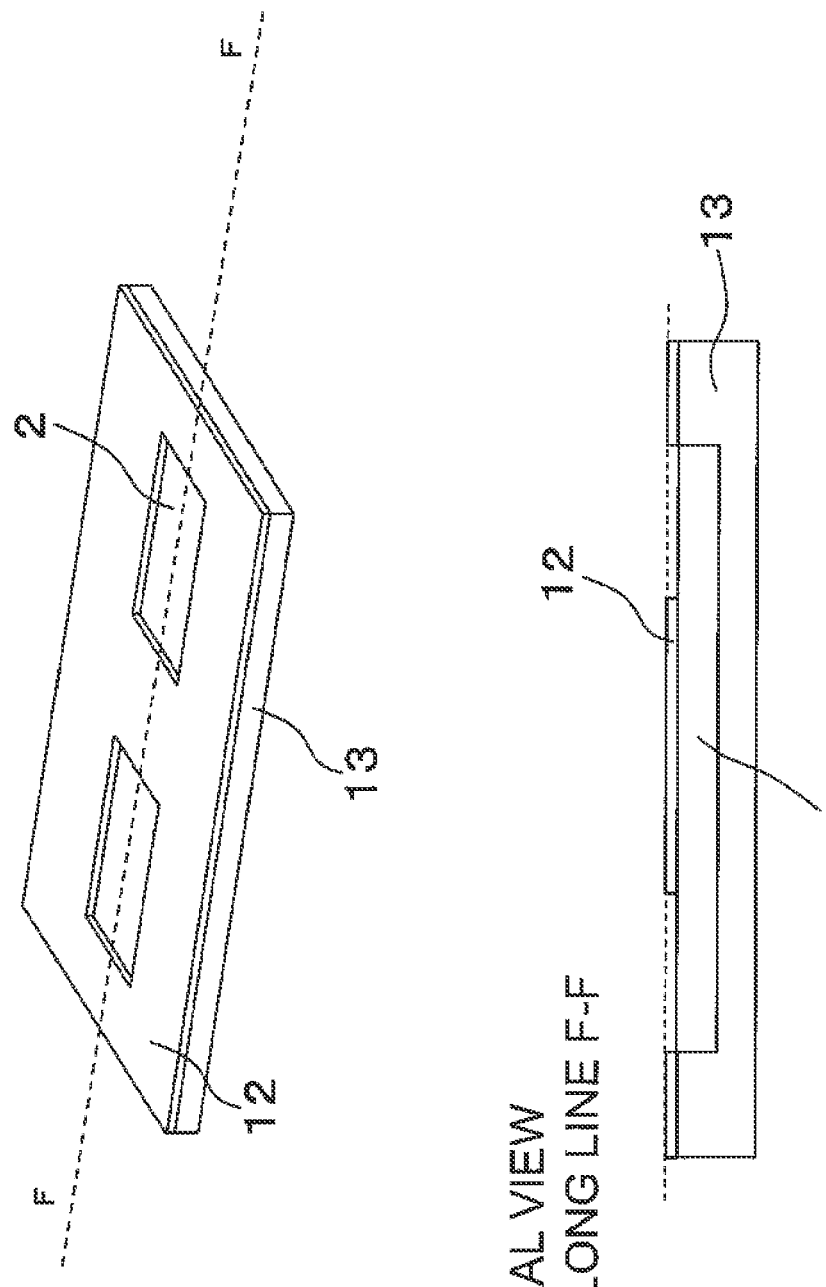

SEMICONDUCTOR DEVICE

CROSS REFERENCE TO RELATED APPLICATIONS

This application is a National Stage of International Application No. PCT/JP2013/062734 filed Apr. 24, 2013, claiming priority based on Japanese Patent Application No. 2012-139559, filed Jun. 21, 2012, the contents of all of which are incorporated herein by reference in their entirety.

TECHNICAL FIELD

This invention relates to a semiconductor device and a method of manufacturing the same, and more particularly, to a semiconductor device capable of reading an information recorded state by using a magnetic tunnel junction element and a method of manufacturing the same.

BACKGROUND ART

With technology development in recent years, the following semiconductor device having nonvolatile characteristics of recorded information has been put to practical use. Specifically, a stripe pattern of a soft magnetic material is divided into two regions of different magnetization directions, and, by moving a domain wall on a boundary thereof through a spin torque phenomenon by current which is passed through the stripe, a magnetization direction at a specified location (information recording portion) of the stripe pattern is caused to be one of two different directions, which enables writing and holding information intended to be recorded as 0 or 1 with 0 and 1 being discriminated from each other. Further, by detecting the magnetization direction of the specified location by a magnetic tunnel junction element formed adjacent thereto, the state of the information intended to be recorded, i.e., whether the information is 0 or 1, can be read nondestructively.

For example, a related-art semiconductor device disclosed in Patent Document 1 and Non Patent Document 1 adopts a basic structure in which, as illustrated in FIG. 9, the semiconductor device includes, above both ends of a stripe pattern 2 of a soft magnetic material 1 that is equivalent to the information recording portion and that is a first magnetic layer, a first island pattern 4 and a second island pattern 5 of a hard magnetic material 3 as a second magnetic layer that can be magnetically coupled to the first magnetic layer, and, a magnetic tunnel junction element 6 is formed above a portion between the first island pattern 4 and the second island pattern 5 at a distance where a leakage magnetic field from a center portion of the stripe pattern 2 can be detected.

In the above-mentioned semiconductor device illustrated in FIG. 9, a structure of the information recording portion is characteristic. Specifically, the first island pattern 4 and the second island pattern 5 of the hard magnetic material 3 have different magnetization directions, and thus, two different magnetization direction regions are formed in the stripe pattern 2 of the soft magnetic material 1 which is formed in a state of being magnetically coupled thereto, and a domain wall 7 which is a boundary of the two magnetization directions is formed somewhere between the two regions. FIG. 9 illustrates a case in which the domain wall 7 is formed in proximity to the first island pattern 4.

In the semiconductor device illustrated in FIG. 9, when current is passed through the stripe pattern 2 from the first island pattern 4 side, due to the spin torque phenomenon, the domain wall 7 moves. Specifically, the magnetization direction region on the first island pattern 4 side becomes larger, and the domain wall 7 moves close to the second island pattern 5 having the different magnetization direction on the second island pattern side. At this time, if current in a reverse direction is passed, the reverse occurs, and the domain wall 7 passes the center portion of the stripe pattern 2 and returns to the proximity of the first island pattern 4 on the opposite side. In this way, the magnetization direction of the center portion of the stripe pattern 2 can be changed by the direction of passing current. This portion is the information recording portion of the semiconductor device.

Note that, the magnetic tunnel junction element 6 is disposed so as to read the magnetization direction of the center portion of the stripe pattern 2 through a leakage magnetic field, and can read whether information recorded in the information recording portion is 1 or 0. For example, when a perpendicular magnetic film is used as the stripe pattern 2, by using an in-plane magnetic film as the magnetic tunnel junction element 6, and, by disposing a center line of the stripe pattern 2 and a center of the magnetic tunnel junction element 6 at a distance from each other which is appropriate for reading the information, a semiconductor device which can read and write is formed.

Further, it is not necessary that the soft magnetic material 1 and the hard magnetic material 3 be a combination of the soft magnetic material 1 and the hard magnetic material 3 which is typically referred to, and it is sufficient that a combination of magnetic materials having different magnetic characteristics resulting in different coercive forces be adopted. It is sufficient that portions of the stripe pattern 2 of the soft magnetic material 1 in magnetic contact with the first island pattern 4 and the second island pattern 5, respectively, of the hard magnetic material 3 be magnetized so as to be magnetically in parallel.

Next, a method of manufacturing the information recording portion of the semiconductor device illustrated in FIG. 9 is described below with reference to FIG. 10A to FIG. 10E.

First, in the semiconductor device of Patent Document 1 and Non Patent Document 1, a case is described where a multilayer film in which a Co film and an Ni film are alternately stacked is used as the soft magnetic material 1, and a multilayer film in which a Co film and a Pt film are alternately stacked is used as the hard magnetic material 3.

(i) First, as illustrated in FIG. 10A, the soft magnetic material 1 in which a Co film and an Ni film are alternately stacked as the first magnetic layer, the hard magnetic material 3 in which a Co film and a Pt film are alternately stacked as the second magnetic layer, and an upper electrode material 10 which is a Ta film are formed on a substrate by a sputtering method.

(ii) Then, as illustrated in FIG. 10B, only the upper electrode material 10 and the hard magnetic material 3 are etched into shapes of the first island pattern 4 and the second island pattern 5. An appropriate mask and an argon ion milling method are used in the etching, and the etching ends when the soft magnetic material 1 is exposed.

(iii) Then, as illustrated in FIG. 10C, a mask for the stripe pattern 2 is formed on the first island pattern 4 and the second island pattern 5 which are formed, and etching is carried out by the argon ion milling method until unnecessary portions of the soft magnetic material 1 in the lowest layer are removed.

(iv) Finally, as illustrated in FIG. 10D, by etching part of the hard magnetic material 3 of the second island pattern 5, the information recording portion of the related-art semiconductor device is formed. Here, the part of the hard magnetic material 3 of the second island pattern 5 is etched so that, while using the same hard magnetic material 3, the first island pattern 4 and the second island pattern 5 have different magnetic characteristics.

(v) As the semiconductor device, after this, as illustrated in FIG. 10E, the magnetic tunnel junction element 6 is disposed so as to read the magnetization direction of the information recording portion at the center portion of the stripe pattern 2 through a leakage magnetic field to manufacture the semiconductor device which can read and write.

On the other hand, as disclosed in, for example, Patent Document 2, there are known a method of manufacturing a magnetic head, a magnetic head, and a magnetic recording device which adopt another related art that facilitates detection of an etching end point.

In Patent Document 2, as illustrated in FIG. 11, there have been proposed a method of manufacturing a magnetic head, a magnetic head, and a magnetic recording device in which, immediately below a pattern formed by etching, an end point detection layer 12 having different light emitting characteristics is locally embedded in advance in an interlayer insulating material 13 as a base, and, when etching is carried out to form a trench shape for a magnetic layer 14, exposure of the end point detection layer 12 is detected using emission spectrography. As the method of manufacturing a magnetic head, after an insulating layer 15 is formed on the interlayer insulating material 13 in which the end point detection layer 12 is embedded, a pattern is formed by etching. At that time, an etching end point is detected by a material released from the end point detection layer 12. After that, the magnetic layer 14 is embedded.

PRIOR ART DOCUMENTS

Patent Document

Patent Document 1: JP-2009-526372 (FIG. 1)
Patent Document 2: JP-A-2009-181615 (FIG. 3)

Non Patent Document

Non Patent Document 1: 2012, pp. 07C903 (H. Honjo et al., Journal of Applied Physics, vol. 111, pp. 07C903 (2012))

DISCLOSURE OF THE INVENTION

Problems to be Solved by the Invention

However, the related arts have the following problems.

First, the semiconductor device and the method of manufacturing the same disclosed in Patent Document 1 have a problem in that, in manufacturing the semiconductor device of Patent Document 1 using a latest manufacturing process, in the above-mentioned step illustrated in FIG. 10B, it is difficult to detect the etching end point of the hard magnetic material 3. This problem arises from not being able to apply the argon ion milling method used in Patent Document 1 due to an increased size of the substrate used in the latest manufacturing process.

Here, in manufacturing a semiconductor device, the size of the substrate to be used has been increased in order to increase mass production efficiency. Therefore, a manufacturing apparatus for manufacturing the semiconductor device is also becoming ready for a large substrate. At the time of 2012, a typical wafer diameter is 300 millimeters. However, it is difficult for the argon ion milling method to accommodate the substrate size of 300 millimeters. The reason is that it is difficult to manufacture an apparatus for applying ions in a uniform direction with a uniform current density to the entire 300 millimeter substrate. Therefore, as a dry etching method when a 300 millimeter substrate is used, a plasma etching method is widely used which accelerates and applies ions from the plasma to the substrate by directly exposing the substrate to plasma, and at the same time, applying a high frequency or low frequency bias potential to the substrate.

Generally, in the argon ion milling method, secondary ion mass spectrometry has been used to detect the etching end point. Secondary ion mass spectrometry is a technology which enables, by ionizing atoms released from the substrate and carry out mass spectrometry, detection of an end point of a material intended to be etched. When secondary ion mass spectrometry is used, it is necessary to increase the vacuum during the etching, which is possible with regard to the argon ion milling method.

On the other hand, in order to generate plasma in a dry etching apparatus when a 300-millimeter substrate is used, a gas pressure higher than that in an apparatus used for an ion milling method is necessary, and, due to the gas pressure, secondary ion mass spectrometry cannot be used. Therefore, in a plasma etching apparatus, emission spectrography has been widely used as an etching end point detection technology instead of secondary ion mass spectrometry. Emission spectrography is a technology for detecting a chemical species such as an atom, a molecule, a radical, an ion, or the like which exists in plasma by spectroscopic measurement of light having an intrinsic wavelength emitted when an atom or a molecule existing in the plasma or a reaction product with the etching plasma is excited by electron collision in the plasma, and then is de-excited from the excited state to a lower state in energy. If a chemical species which appears only at a timing to be the etching end point can be detected, that point in time can be regarded as the etching end point.

However, as described above, with regard to the information recording portion of the related-art semiconductor device described above, the multilayer film in which a Co film and an Ni film are alternately stacked is used as the soft magnetic material 1, and the multilayer film in which a Co film and a Pt film are alternately stacked is used as the hard magnetic material 3.

As described in (ii) of the method of manufacturing the information recording portion of the related-art semiconductor device, when the multilayer film in which a Co film and a Pt film are alternately stacked is etched by a plasma etching method, while Co, which has a comparatively small atomic weight, is likely to emit light in plasma, Co is also contained in the multilayer film in which a Co film and an Ni film are alternately stacked, which is the soft magnetic material 1 as a base to be the etching end point. Thus, accurate end point detection cannot be made. Further, to begin with, Pt, which has a comparatively large atomic weight, emits only weak light, and thus, detection thereof is difficult. Therefore, it is difficult to accurately detect the end point in etching the hard magnetic material 3. As a matter of course, light emission of Ni can be detected when Ni in the soft magnetic material 1 as the base begins to be etched, but, at that point in time, etching of the multilayer film in which a Co film and a Pt film are alternately stacked is already over, which means that unnecessary excessive etching is carried out.

When the etching end point cannot be detected, the semiconductor device does not operate both when the etching time is too short and when the etching time is too long. First, when the etching time is short and the hard magnetic material 3 is not fully etched out and remains on the substrate, due to a strong coercive force of the hard magnetic material 3, it is difficult for the domain wall 7 in the soft magnetic material 1 to move. When the etching time is long and plasma is applied excessively after the hard magnetic material 3 is etched out, the layer of the soft magnetic material 1 is modified by the etching plasma application, which also makes it difficult for the domain wall 7 to move.

Further, applying the technology of the method of manufacturing a magnetic head, the magnetic head, and the magnetic recording device disclosed in Patent Document 2 to a semiconductor device including a first magnetic layer and a second magnetic layer disposed above the first magnetic layer and magnetically coupled to the first magnetic layer as in the semiconductor device of this invention has the following problem.

The problem arises from a manufacturing method which necessitate embedding in advance, with regard to a pattern portion necessary for the semiconductor device of this invention or a region having nothing to do with a pattern necessary for the semiconductor device of this invention, the end point detection layer 12 having different light emitting characteristics in the interlayer insulating material 13.

First, two methods are known for smoothly embedding, in a substrate, a different material. One of the methods is a "damascene process". In this "damascene process", a groove pattern to be embedded in a base is formed in advance in the interlayer insulating material 13 by photolithography and the dry etching method, the material having different light emitting characteristics is formed on an entire surface including the groove pattern portion, a material for planarization is formed thereon as necessary, and protruding portions are removed by a chemical mechanical polishing method or the dry etching method. The other of the methods is an "embedding planarization method". In this "embedding planarization method", first, the material having different light emitting characteristics is formed, and then, the material having different light emitting characteristics is patterned into a desired shape by photolithography and the dry etching method, and, after a film formed of a material of the interlayer insulating material 13 is formed to embed a periphery of the pattern, the pattern of the end point detection layer 12 embedded using the chemical mechanical polishing method or the dry etching method is exposed and the interlayer insulating material 13 on the periphery is planarized.

In order to apply the related art disclosed in Patent Document 2, it is necessary to apply any one of the embedding methods described above to the manufacture of the semiconductor device of this invention. In that case, the application is difficult because there is a problem arising from a structure of the semiconductor device of this invention.

In the following, difficulty in applying the related art of Patent Document 2 to the manufacture of the semiconductor device of this invention is described referring to FIG. 12A to FIG. 12D as figures for reference.

First, the related art has two points. One of the points is that the related art is a manufacturing method in which, by exposure of the end point detection layer 12, the etching end point is detected to end the etching. The other of the points is that the end point detection layer 12 is patterned in advance. Note that, the pattern may be related to a pattern of any layer, or may be at an irrelevant location on the same surface.

Further, basically, in the semiconductor device of this invention, it is necessary that a surface of the etching end point be located higher than an upper surface of the soft magnetic material 1. This means that the upper surface of the soft magnetic material 1 is not allowed to be exposed to the etching plasma when the island pattern 4 and the island pattern 5 of the hard magnetic material 3 as a higher layer are simultaneously formed. When exposed, it is for sure that the soft magnetic material 1 is deteriorated, and the invention of the subject application is an invention for avoidance thereof. At the same time, as a matter of course, in the etching when the first island pattern 4 and the second island pattern 5 of the hard magnetic material 3 are simultaneously formed, it is necessary that the hard magnetic material 3 except for portions necessary as the two island patterns be completely removed.

Accordingly, for example, as illustrated in FIG. 12A as a figure for reference, suppose that the end point detection layer 12 and the soft magnetic material 1 are patterned and embedded in advance in the interlayer insulating material 13, the hard magnetic material 3 is formed thereon, and the two island patterns are formed. In order to detect the etching end point, it is necessary to, when the two island patterns are etched, expose the end point detection layer 12 at a location other than the two island patterns, and thus, an unnecessary soft magnetic material pattern 16 is formed. In the case of this manufacturing method, the end point detection layer 12 which is formed subsequently to the soft magnetic material 1 is, after that, patterned at the same time into shapes of the stripe pattern 2 and the unnecessary soft magnetic material pattern 16, and is embedded in the interlayer insulating material 13 by the embedding planarization method. However, this manufacturing method has a problem in terms of the accuracy in a manufacturing process. Specifically, a thickness of the end point detection layer 12 accepted in the semiconductor device of this invention is very small. As described in an example of the invention of the subject application, in order to obtain magnetic coupling between the soft magnetic material 1 and the hard magnetic material 3, the end point detection layer 12 has a thickness of about from 1 to 2 nanometers. In the embedding planarization method described above, with regard to appropriate exposure of an embedded material, due to control characteristics in the manufacturing process, it is difficult to expose with satisfactory controllability even a material having a film thickness as large as 5 nanometers. In other words, it is impossible to leave a very thin film material forming the end point detection layer 12 in an embedded state, and to, at that time, complete a step of the embedding planarization method without exposing the soft magnetic material 1 as the base. Further, existence of the unnecessary soft magnetic material pattern 16 places a constraint on design of the entire semiconductor device, which causes another problem in terms of manufacture.

Next, as illustrated in FIG. 12B as a figure for reference, when the end point detection layer 12 is patterned into a shape other than the stripe pattern 2, the unnecessary soft magnetic material pattern 16 is prevented from being formed, but it is necessary to pattern the stripe pattern 2 in advance on the soft magnetic material 1, and it is necessary to bring a mask material into direct contact with the upper surface of the soft magnetic material 1. As a result, difficulty occurs in magnetic coupling between the soft magnetic material 1 and the hard magnetic material 3 to be formed in a later step. Specifically, in the semiconductor device of this invention, it is necessary that the soft magnetic material 1 as the first magnetic layer and the hard magnetic material 3 as the second magnetic layer be magnetically coupled to each other by magnetostatic coupling or exchange coupling. First, when magnetic coupling between layers is necessary in a stacked structure of those thin film magnetic materials, it is not ordinary to discontinue film formation in a vacuum for a time in midstream, to expose the wafer to the atmosphere, and to carry out the rest of the film formation in a vacuum. This is because, if a natural oxide film is formed on the surface of the material or a material of a different kind such as an organic material which floats in the atmosphere attaches to the surface of the material, magnetic coupling between the first magnetic layer and the second magnetic layer becomes difficult. However, when the related art is forcibly applied to the structure illustrated in FIG. 12B, it is not possible to form the end point detection layer 12 continuously.

Next, as illustrated in FIG. 12C as a figure for reference, when the end point detection layer 12 is patterned at another location, in addition to the problem of the magnetic coupling in the case illustrated in FIG. 12B, the hard magnetic material 3 remains at a location other than the pattern of the end point detection layer 12.

Next, as illustrated in FIG. 12D as a figure for reference, when the entire surface is covered with the end point detection layer 12, the hard magnetic material 3 does not remain, but the problem of the magnetic coupling still exists.

Further, in the manufacturing method of Patent Document 2 in which an additional step is indispensable in forming such an embedded structure of the end point detection layer 12, increase in manufacturing cost cannot be avoided, which greatly reduces the value of the semiconductor device of this invention.

Accordingly, this invention solves the problems of the related art. Specifically, it is an object of this invention to provide a semiconductor device having a structure in which at least two kinds of magnetic materials having different functions, i.e., a first magnetic layer and a second magnetic layer, are vertically stacked, the two kinds of magnetic layers being magnetically coupled to each other by magnetostatic coupling or exchange coupling, in which the magnetic material forming the second magnetic layer as the upper layer is etched out using accurate etching end point detection, and, at that time, characteristics of the magnetic material forming the first magnetic layer as the lower layer are not affected, and a method of manufacturing the same.

Means to Solve the Problems

According to one embodiment of this invention, the above-mentioned problems are solved by providing a semiconductor device, including: a first magnetic layer disposed on a flat substrate surface; a second magnetic layer disposed above the first magnetic layer and magnetically coupled to the first magnetic layer by magnetostatic coupling or exchange coupling; and a third thin film layer formed between the first magnetic layer and the second magnetic layer, the third thin film layer having such a thickness as to avoid inhibiting the magnetic coupling between the first magnetic layer and the second magnetic layer.

According to one embodiment of this invention, the above-mentioned problems are solved by providing a method of manufacturing a semiconductor device, including the steps of: forming in sequence a first magnetic layer, a third thin film layer, and a second magnetic layer in the order of the first magnetic layer, the third thin film layer, and the second magnetic layer on a flat substrate surface; etching the second magnetic layer using a mask pattern by a dry etching method using plasma; and detecting, during the etching, by plasma emission spectrography, light emitted from an atom or a molecule in the third thin film layer including a material including atoms which are not contained in the second magnetic layer, or a material which causes satisfactory difference in light emitting characteristics with the second magnetic layer even when included also in the second magnetic layer, or light emitted stemming from a reaction product in the plasma, to detect an etching end point of the second magnetic layer.

Effect of the Invention

According to one embodiment of this invention, by inserting the third thin film layer between the first magnetic layer and the second magnetic layer, carrying out the film formation in sequence on the entire surface of a wafer, and determining that the etching end point is reached when a signal of the third thin film layer is detected in etching using a mask having a desired patterned shape, the second magnetic layer can be accurately etched out without exposing the first magnetic layer as the lower layer to etching plasma to deteriorate magnetic characteristics and without leaving the second magnetic layer as the upper layer to deteriorate operating characteristics of the semiconductor device.

Further, in the manufacturing method, the first magnetic layer, the third thin film layer, and the second magnetic layer are formed in sequence on the entire surface of the wafer, and, by appropriately selecting a thickness of the third thin film layer, magnetic coupling between the first magnetic layer and the second magnetic layer by magnetostatic coupling or exchange coupling is adequately possible, and the semiconductor device without an elevation change can be manufactured. As a result, the manufactured semiconductor device can realize satisfactory characteristics with high yields.

BRIEF DESCRIPTION OF THE DRAWING

FIG. 6 shows dry etching conditions used in a method of manufacturing the semiconductor device of the first embodiment of this invention.

FIG. 12A is a figure for reference illustrating a problem when a method of manufacturing the related-art magnetic head is applied to the manufacture of the semiconductor device of the invention of the subject application, and is a figure for reference illustrating Exemplary Review 1.

FIG. 12B is a figure for reference illustrating a problem when the method of manufacturing the related-art magnetic head is applied to the manufacture of the semiconductor device of the invention of the subject application, and is a figure for reference illustrating Exemplary Review 2.

FIG. 12C is a figure for reference illustrating a problem when the method of manufacturing the related-art magnetic head is applied to the manufacture of the semiconductor device of the invention of the subject application, and is a figure for reference illustrating Exemplary Review 3.

FIG. 12D is a figure for reference illustrating a problem when the method of manufacturing the related-art magnetic head is applied to the manufacture of the semiconductor device of the invention of the subject application, and is a figure for reference illustrating Exemplary Review 4.

MODES FOR EMBODYING THE INVENTION

Now, embodiments of this invention are described in detail with reference to the drawings.

EXAMPLES

Figure 1:
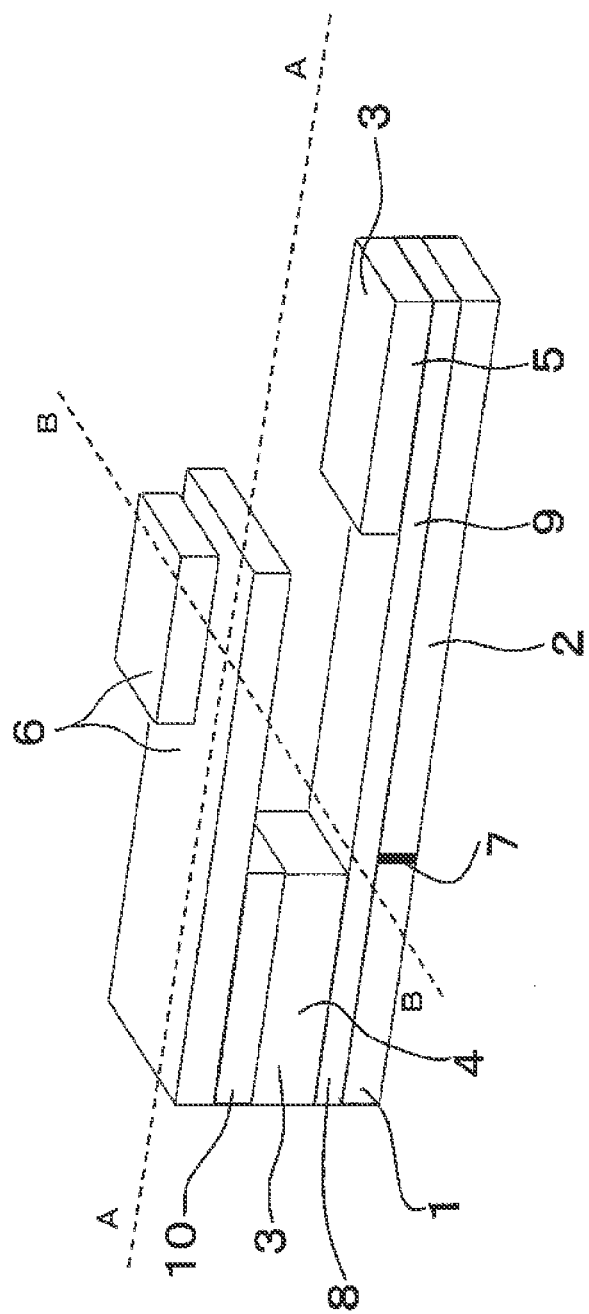
FIG. 1 is a perspective view illustrating a semiconductor device of a first embodiment of this invention.
Figure 2:
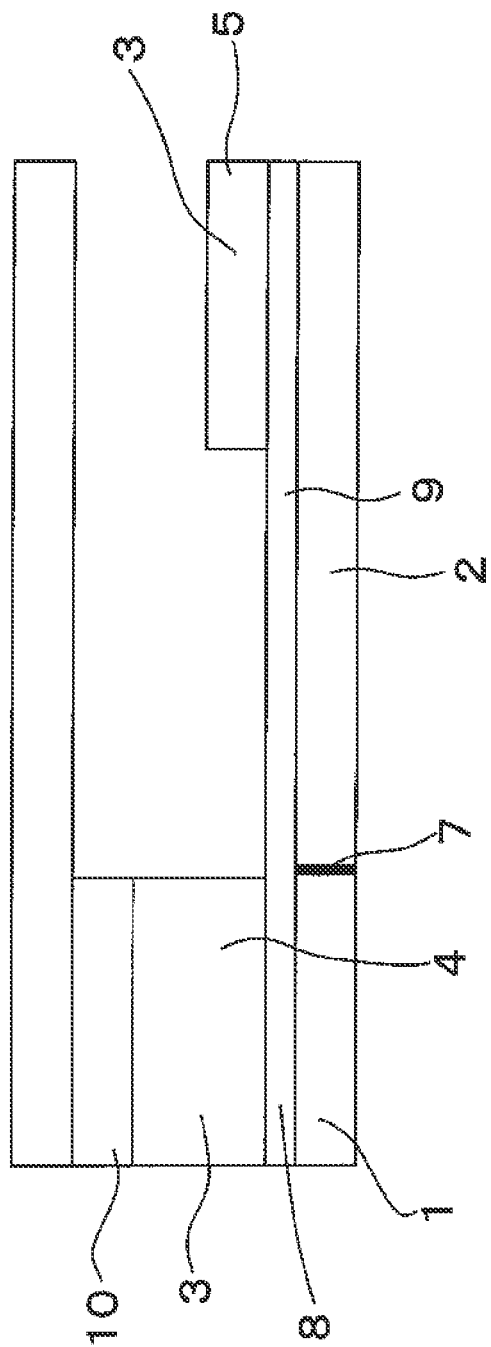
FIG. 2 is a sectional view taken along the line A-A of the semiconductor device of the first embodiment of this invention.
Figure 3:
FIG. 3 is a sectional view taken along the line B-B of the semiconductor device of the first embodiment of this invention.
Figure 3:
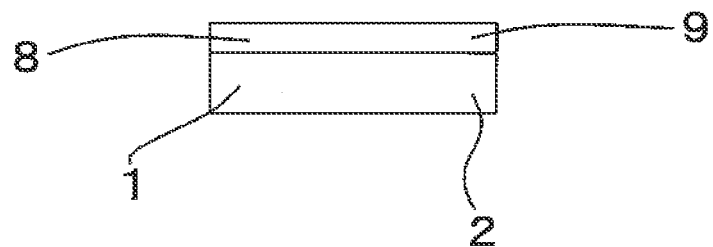

With reference to FIG. 1, FIG. 1 is a perspective view of a semiconductor device according to a first embodiment of this invention. FIG. 2 and FIG. 3 are sectional views taken along the lines A-A and B-B, respectively, of FIG. 1. As a pattern including an information recording portion, a pattern of a soft magnetic material 1 onto which a stripe pattern 2, a first island pattern 4, and a second island pattern 5 are projected is formed on a substrate 17. There is formed, on the pattern of the soft magnetic material 1, a third thin film layer 8 which is inserted for detection of an etching end point when a hard magnetic material 3 is etched. The hard magnetic material 3 having shapes of the first island pattern 4 and the second island pattern 5 is formed on the third thin film layer 8. Note that, the first island pattern 4 and the second island pattern 5 are adjusted so as to have different magnetic characteristics.

Further, as illustrated in FIG. 3, similarly to the case of the related art, a magnetic tunnel junction element 6 is disposed so as to read a magnetization direction of a center portion of the stripe pattern 2 through a leakage magnetic field, and can read whether information recorded in the information recording portion is 1 or 0.

In the semiconductor device, when the hard magnetic material 3 of the first island pattern 4 and the second island pattern 5 is etched, it can be determined that the etching end point is reached when the third thin film layer 8 appears, and thus, both complete removal of the hard magnetic material 3 and inhibition of excess etching of the soft magnetic material 1 can be satisfied at the same time.

Therefore, improvement in and reduction of variations in characteristics and performance of the semiconductor device of this invention can be attained at the same time, and thus, an effect that the manufacturing yield is improved is achieved.

Next, a manufacturing method of the first embodiment is described with reference to FIG. 4A to FIG. 4E.

Figure 4A:
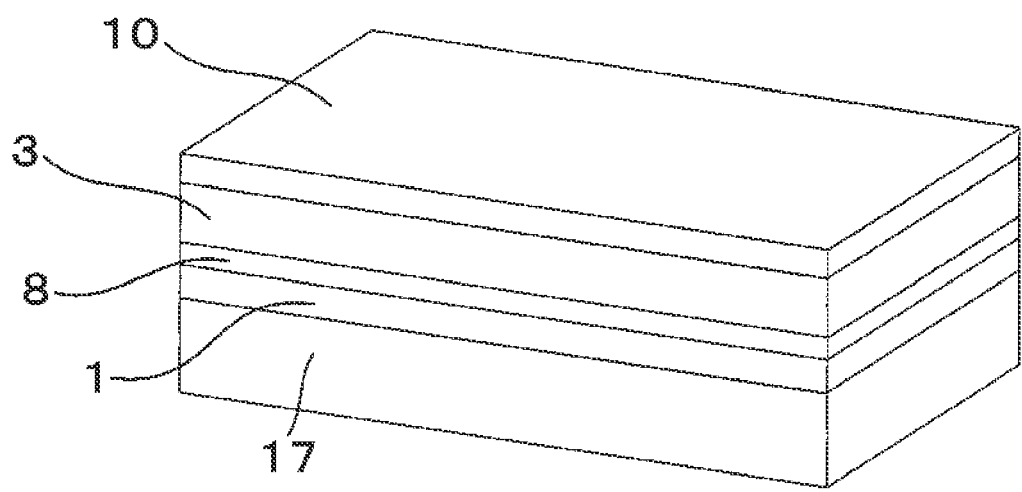
FIG. 4A illustrates a first step of a method of manufacturing the semiconductor device of the first embodiment.
Figure 5:
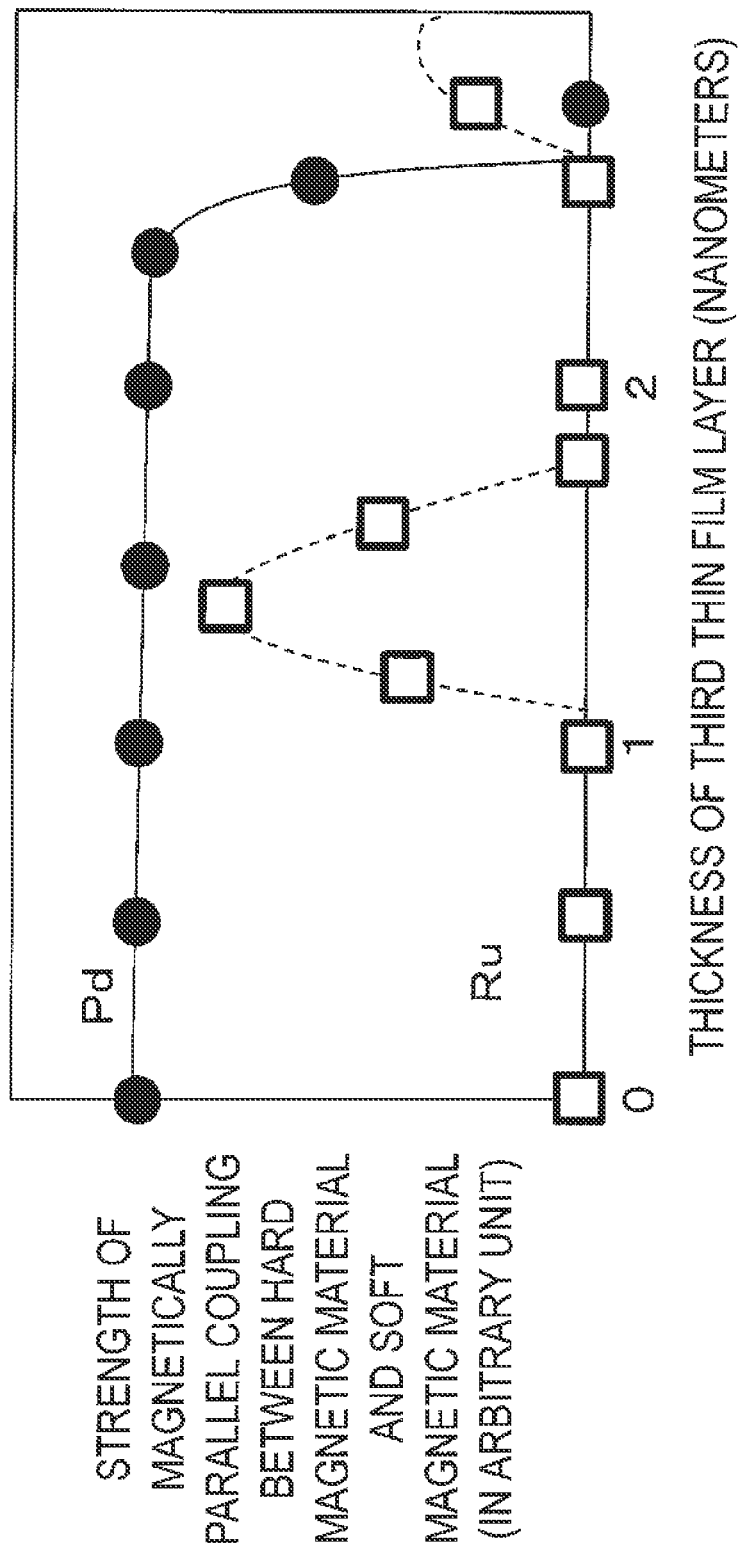
FIG. 5 shows a result of an experiment showing conditions for determining a thickness of a third thin film layer which can form the first embodiment of this invention.

(i) First, as illustrated in FIG. 4A, the soft magnetic material 1 in which a Co film and an Ni film are alternately stacked on a flat substrate surface, a Pd film 9 as the third thin film layer 8, the hard magnetic material 3 in which a Co film and a Pt film are alternately stacked, and an upper electrode material 10 which is a Ta film are formed in sequence by sputtering on an entire surface of the substrate 17 to form a stacked structure of materials for the information recording portion. Here, an experiment of the inventors of this invention has revealed that, in order to maintain magnetically parallel coupling between the soft magnetic material 1 and the hard magnetic material 3, the Pd film 9 as the third thin film layer 8 is required to have a thickness of 2.25 nanometers or less. A result of the experiment is shown in FIG. 5. In this embodiment, as the result of the experiment, film formation at a thickness of 2 nanometers was carried out in which the coupling was confirmed. Note that, in figures other than FIG. 4A, illustration of the substrate 17 is omitted.

Figure 4B:
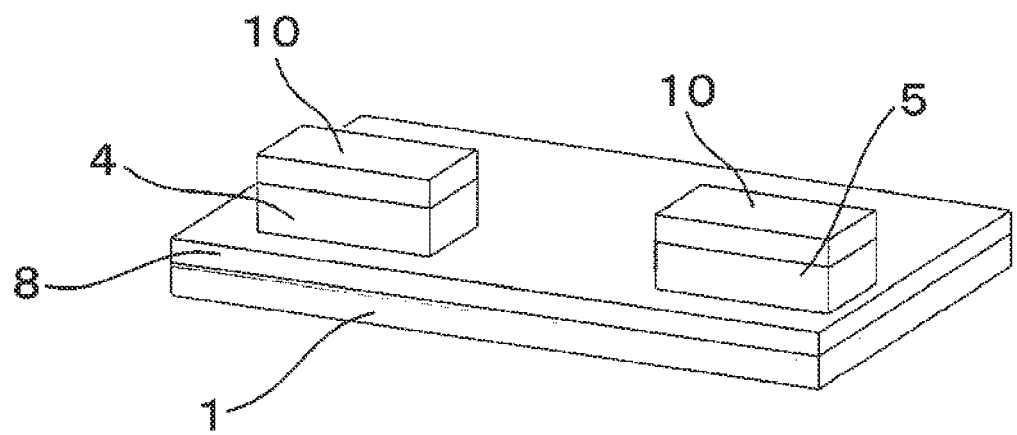
FIG. 4B illustrates a second step of the method of manufacturing the semiconductor device of the first embodiment.
Figure 7:
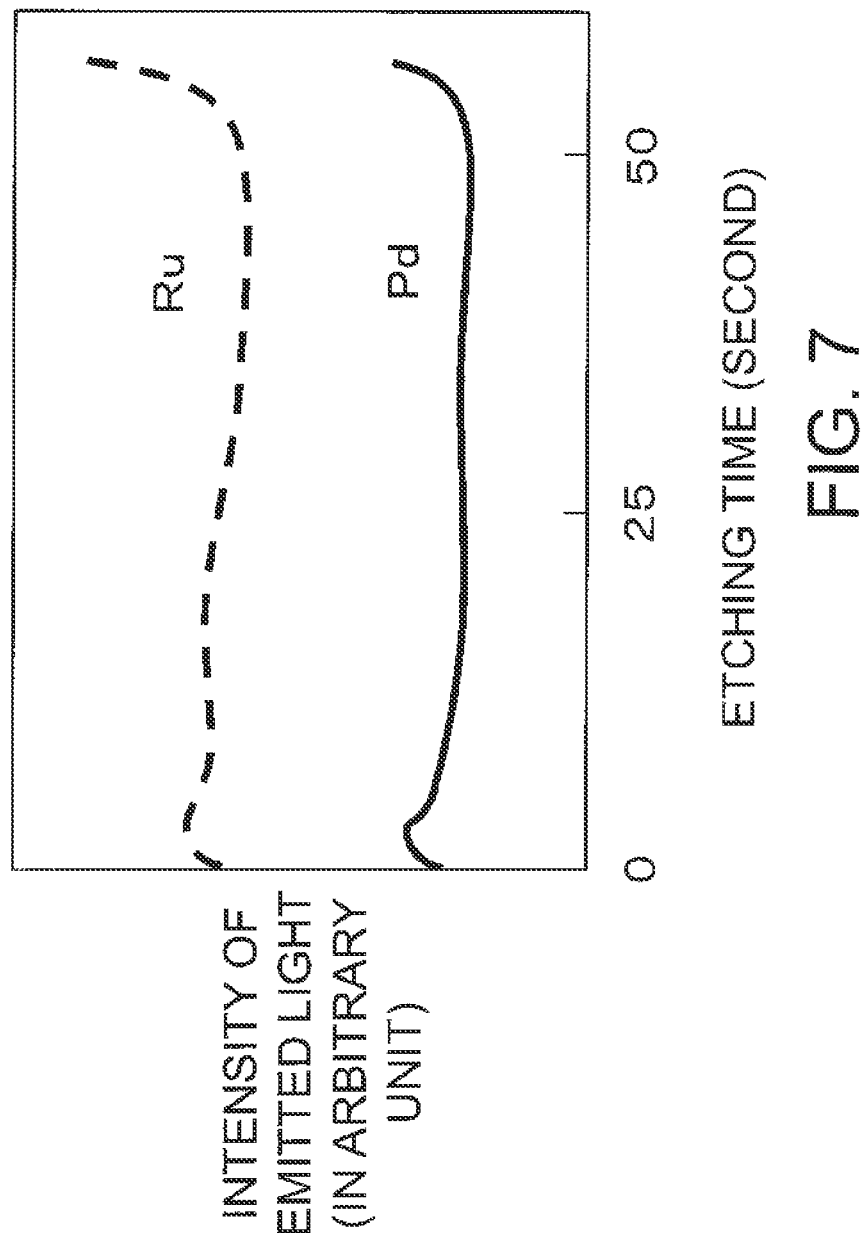
FIG. 7 shows change in intensity of emitted light over time by emission spectrography in a dry etching step used in the method of manufacturing the semiconductor device of the first embodiment of this invention.

(ii) Then, as illustrated in FIG. 4B, the upper electrode material 10 and the hard magnetic material 3 are etched into the shapes of the first island pattern 4 and the second island pattern 5 using an appropriate mask material. Here, in the etching processing, for example, a dry etching apparatus having an inductively coupled plasma source mounted thereon generates plasma of a mixture gas of ammonia and carbon monoxide and a low frequency bias is applied to the substrate 17. FIG. 6 shows etching conditions in this case. As the appropriate mask material, for example, a mask pattern having a stacked structure of a silicon nitride film and a silicon oxide film can be used. With regard to the etching, it is determined that the end point is reached when the Pd film 9 as the third thin film layer 8 is detected by plasma emission spectrography. The solid line of FIG. 7 shows change in intensity of emitted light over time around 363 nanometers which indicates light emission from Pd atoms. After the etching time exceeds 50 seconds, increase in intensity of emitted light is observed.

Figure 4C:
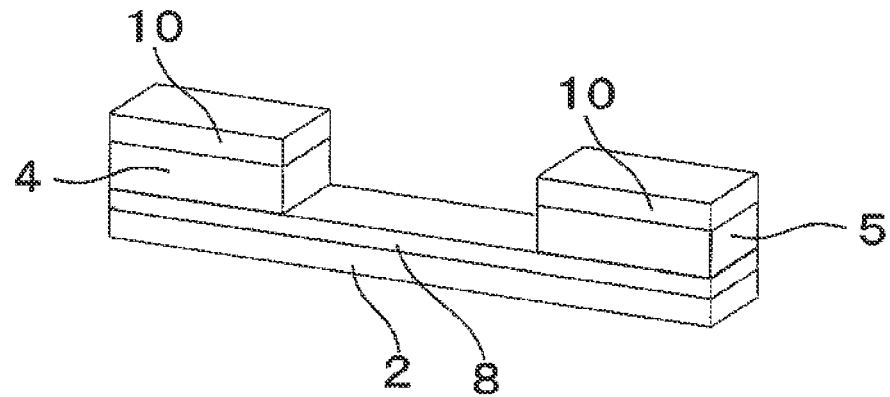
FIG. 4C illustrates a third step of the method of manufacturing the semiconductor device of the first embodiment.

(iii) Then, as illustrated in FIG. 4C, a mask for the stripe pattern 2 is formed on the first island pattern 4 and the second island pattern 5 which are formed, and etching is carried out using the plasma of the mixture gas of ammonia and carbon monoxide until the bottom of the soft magnetic material 1 in the lowest layer is reached. Etching conditions are the same as those shown in FIG. 6. Here, the etching continues until light emitted from Co and Ni contained in the soft magnetic material 1 disappears.

Figure 4D:
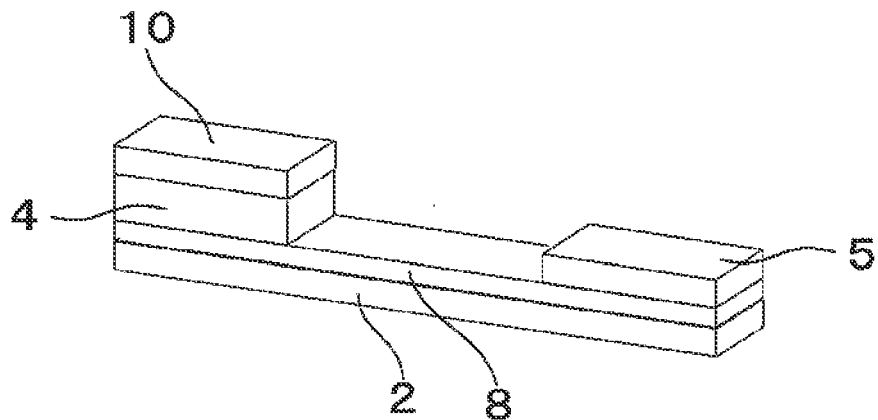
FIG. 4D illustrates a fourth step of the method of manufacturing the semiconductor device of the first embodiment.

(iv) Finally, as illustrated in FIG. 4D, by etching part of the hard magnetic material 3 of the second island pattern 5, the information recording portion of the semiconductor device is obtained.

Figure 4E:
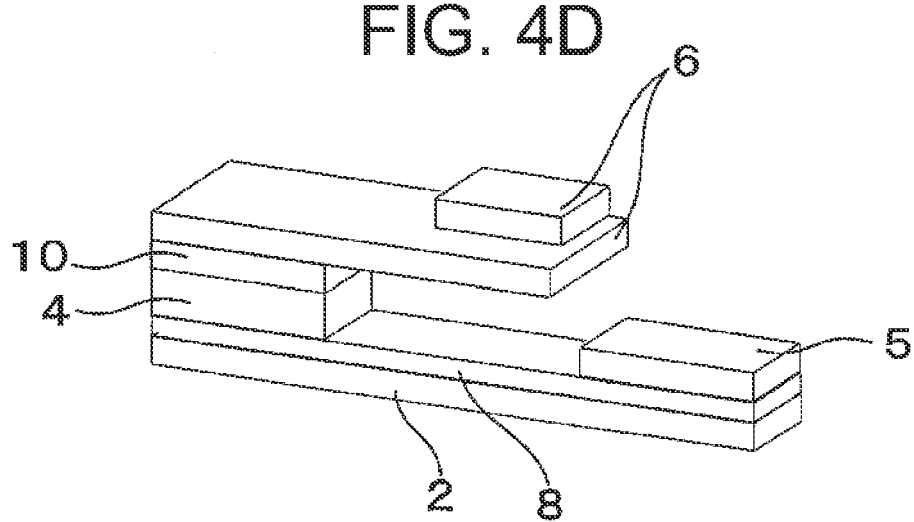
FIG. 4E illustrates a fifth step of the method of manufacturing the semiconductor device of the first embodiment.

(v) As the semiconductor device, after this, as illustrated in FIG. 4E, the magnetic tunnel junction element 6 is disposed so as to read the magnetization direction of the information recording portion at the center portion of the stripe pattern 2 through a leakage magnetic field to manufacture the semiconductor device which can read and write.

In this embodiment, as described in (ii), the etching step is adopted in which, in the case where the upper electrode material 10 and the hard magnetic material 3 are etched into the shapes of the first island pattern 4 and the second island pattern 5 using the appropriate mask material, it is determined that the end point is reached when the Pd film 9 as the third thin film layer 8 is detected by plasma emission spectrography, and thus, both complete removal of the hard magnetic material 3 and inhibition against excess etching of the soft magnetic material 1 can be satisfied at the same time. Therefore, improvement in and reduction of variations in characteristics and performance of the semiconductor device of this invention can be attained at the same time, and thus, the effect that the manufacturing yield is improved is obtained.

Further, in this embodiment, as described in (i), the soft magnetic material 1, the Pd film 9 as the third thin film layer 8, the hard magnetic material 3, and the upper electrode material 10 which is a Ta film are formed in sequence by sputtering on the entire surface of the substrate 17 to form the stacked structure of the materials for the information recording portion, and thus, the structure of a semiconductor device can be realized in which both complete removal of the hard magnetic material 3 and inhibition against excess etching of the soft magnetic material 1 can be satisfied at the same time by a very simple method as a manufacturing method.

Next, a second embodiment of this invention is described below referring to FIG. 8. Here, in the second embodiment, only a structure of the third thin film layer 8 is different from that in the first embodiment, and thus, only points different from those of the first embodiment are described below.

First, while, in the first embodiment, the third thin film layer 8 is formed of the Pd film 9, but, in the second embodiment, the third thin film layer 8 is formed of an Ru film 11.

Figure 8:
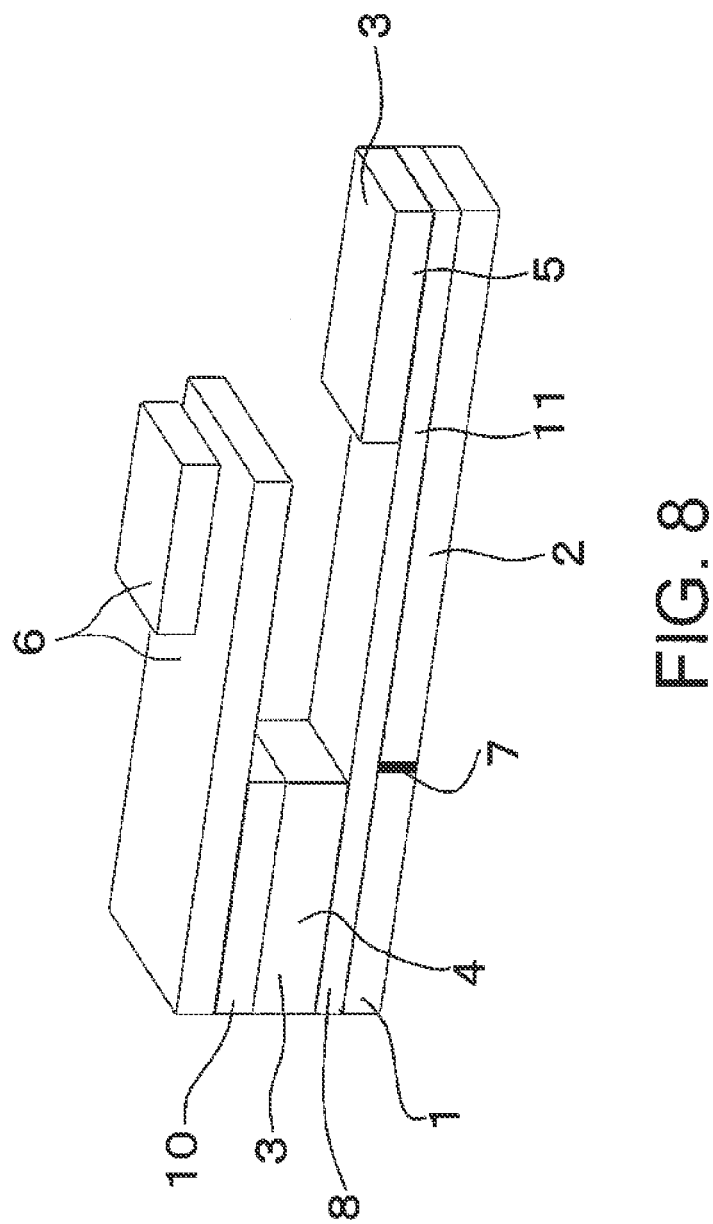
FIG. 8 is a perspective view illustrating a semiconductor device of a second embodiment of this invention.
Figure 9:
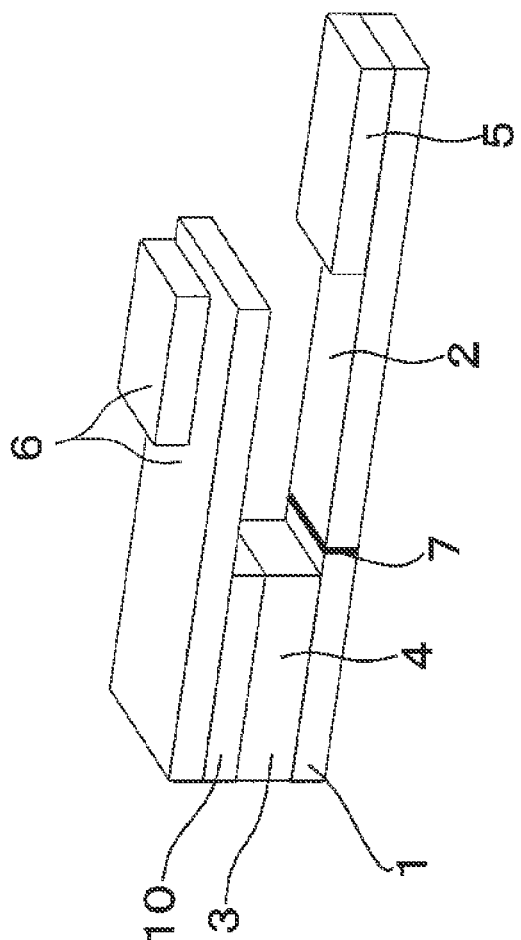
FIG. 9 is a perspective view illustrating a related-art semiconductor device of an embodiment of the related art.
Figure 10A:
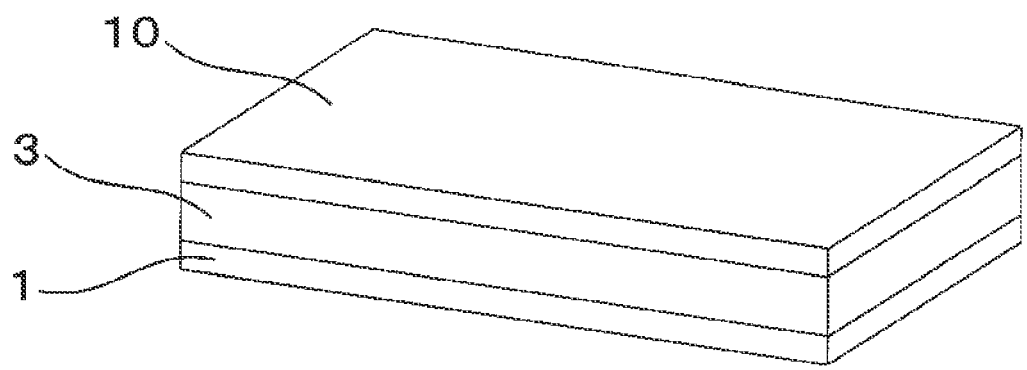
FIG. 10A illustrates a first step of a method of manufacturing the related-art semiconductor device.
Figure 10B:
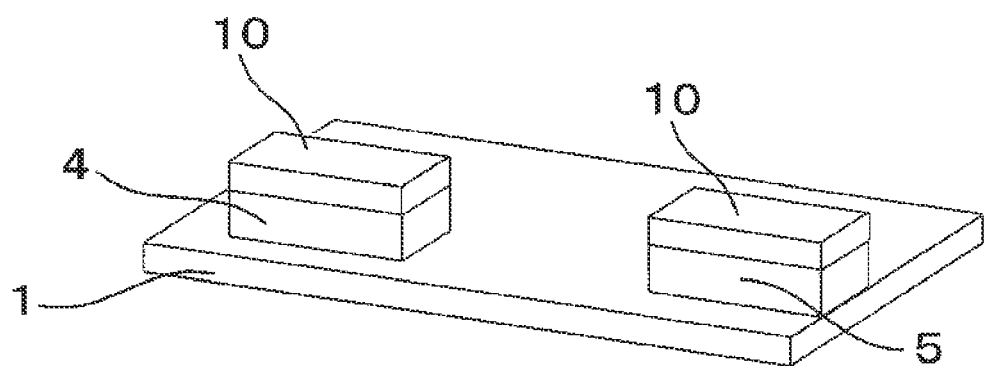
FIG. 10B illustrates a second step of the method of manufacturing the related-art semiconductor device.
Figure 10C:
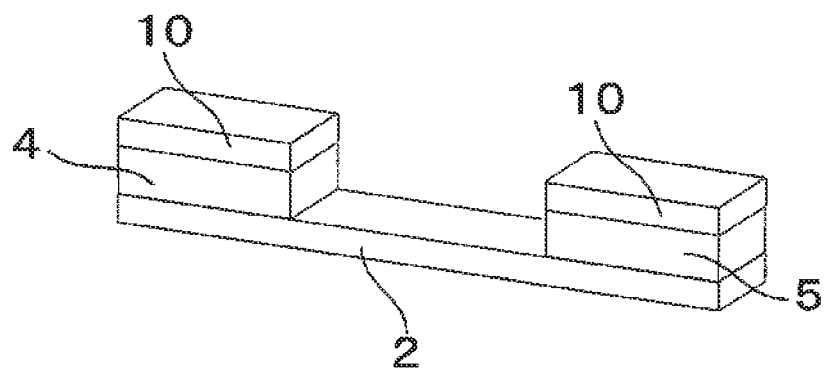
FIG. 10C illustrates a third step of the method of manufacturing the related-art semiconductor device.
Figure 10D:
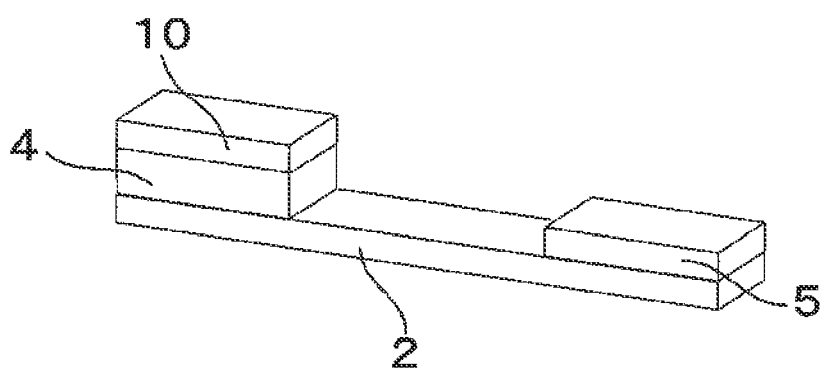
FIG. 10D illustrates a fourth step of the method of manufacturing the related-art semiconductor device.
Figure 10E:
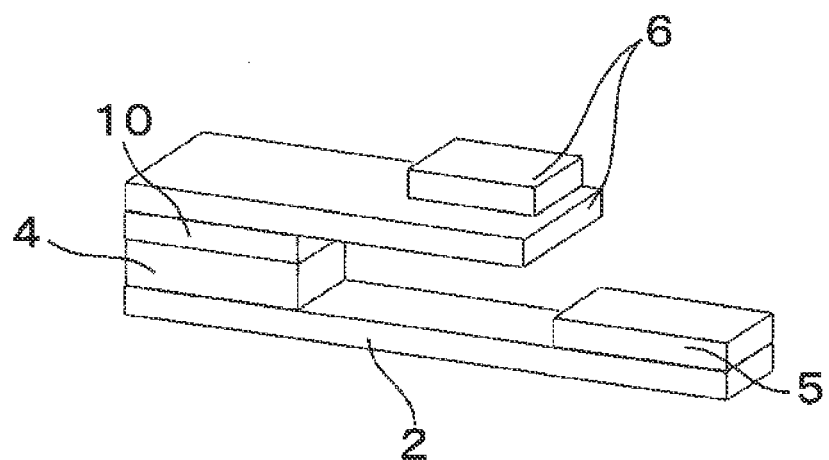
FIG. 10E illustrates a fifth step of the method of manufacturing the related-art semiconductor device.
Figure 11:
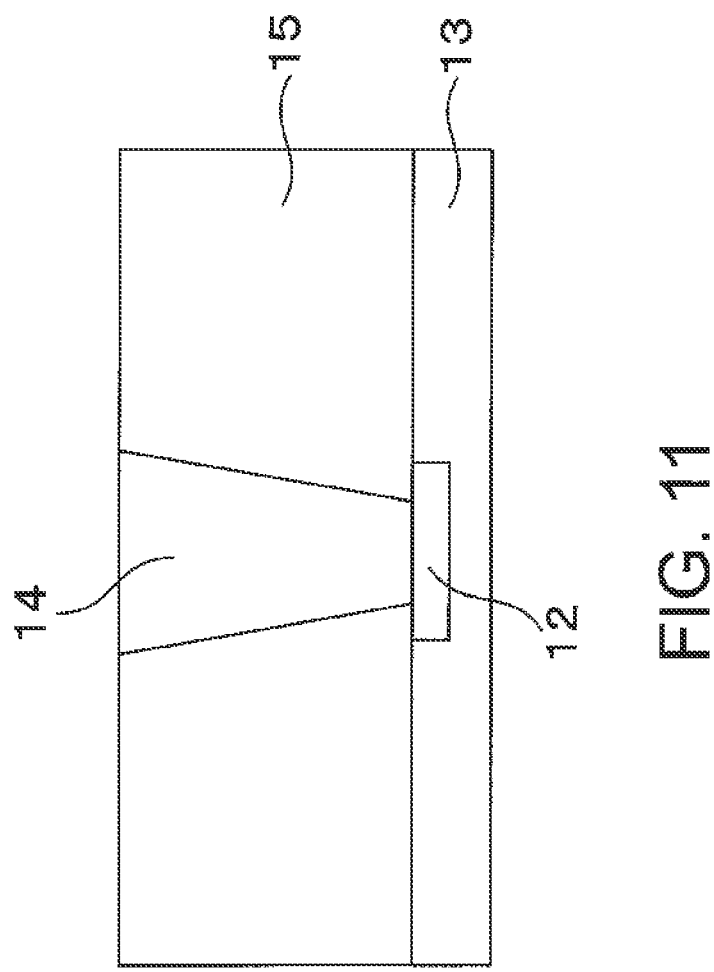
FIG. 11 is a sectional view illustrating a related-art magnetic head of an embodiment of the related art.

The second embodiment is illustrated in FIG. 8. Further, strength of magnetically parallel coupling between the hard magnetic material 3 and the soft magnetic material 1 when the third thin film layer 8 is the Ru film 11 is plotted in FIG. 5.

Further, in the second the embodiment of this invention, the third thin film layer 8 is formed of Ru of 1.4 nanometers. The broken line of FIG. 5 shows strength of parallel magnetic coupling between the hard magnetic material 3 and the soft magnetic material 1 when the thickness of the Ru film 11 is changed. This structure has a special effect that, when etching is carried out using a mixture gas of ammonia and carbon monoxide by a dry etching apparatus having an inductively coupled plasma source mounted thereon, the intensity of light emitted from the Ru film 11 as the third thin film layer 8 of this embodiment is higher than that in the case in which the Pd film 9 is used. Note that, as a wavelength of emitted light when emission spectrography is used, atomic light emission of Ru of around 373 nanometers is used. FIG. 7 also shows change in intensity of emitted light of Ru as the broken line. Similarly to the case of Pd, after the etching time exceeds 50 seconds, increase in intensity of emitted light is observed.

Further, in this embodiment in which the third thin film layer 8 is inserted between the first magnetic layer (in this embodiment, soft magnetic material 1) and the second magnetic layer (in this embodiment, hard magnetic material 3) and it is determined that the etching end point is reached when light emission in plasma of the third thin film layer 8 is detected, the material of the third thin film layer 8 may be changed to a material which is other than the Pd film 9 and the Ru film 11 described herein and which is not used for the second magnetic layer. Also, the third thin film layer 8 can include the Pd film 9 or the Ru film 11 at least in an end surface on the second magnetic layer side.

Further, the etching end point may be delayed from immediately after the detection of a light emission signal by the material of the third thin film layer 8 depending on distribution of an etching rate by an apparatus used within the substrate surface. In this case, needless to say, it is desirable that the soft magnetic material 1 forming the first magnetic layer as the base be not excessively etched for improvement in and reduction of variations in characteristics and performance of and improvement in manufacturing yield of the semiconductor device.

The effect of this invention is that, with regard to a semiconductor device having a structure in which at least two kinds of magnetic materials having different functions and having different planar shapes are vertically stacked, a semiconductor device can be provided which, by etching the magnetic material of the upper layer using accurate etching end point detection without affecting characteristics of the magnetic material of the lower layer, realizes improvement in and reduction of variations in characteristics and performance of and improvement in manufacturing yield of the semiconductor device.

Further, a structure for etching end point detection can be realized by a very simple manufacturing process, and a high yield semiconductor device can be provided without increasing the manufacturing cost.

INDUSTRIAL APPLICABILITY

A magnetic random access memory (MRAM) and a semiconductor device used for a spin logic circuit device using a magnetic tunnel junction element are examples of applying this invention.

REFERENCE SIGNS LIST

1 soft magnetic material
2 stripe pattern
3 hard magnetic material
4 first island pattern
5 second island pattern
6 magnetic tunnel junction element
7 domain wall
8 third thin film layer
9 Pd film
10 upper electrode material
11 Ru film
12 end point detection layer
13 interlayer insulating material
14 insulating layer
15 magnetic layer
16 unnecessary soft magnetic material pattern
17 substrate This application claims priority based on Japanese Patent Application No. 2012-139559, filed on Jun. 21, 2012, the entire disclosure of which is incorporated herein.

The invention claimed is:

1. A semiconductor device, comprising:
a first magnetic layer disposed on a flat substrate surface;
a second magnetic layer disposed above the first magnetic layer and magnetically coupled to the first magnetic layer by magnetostatic coupling or exchange coupling; and
a third thin film layer formed between the first magnetic layer and the second magnetic layer, the third thin film layer having such a thickness as to avoid inhibiting the magnetic coupling between the first magnetic layer and the second magnetic layer,
wherein the second magnetic layer comprises a first island pattern and a second island pattern which are formed by etching the second magnetic layer so that a surface of the third thin film layer is exposed, and
wherein the third thin film layer comprises a film layer inserted for detection of an etching end point when the second magnetic layer is etched.

2. A semiconductor device according to claim 1, wherein the third thin film layer includes a material comprising atoms which are not contained in the second magnetic layer, or a material which causes satisfactory difference in light emitting characteristics with the second magnetic layer even when included also in the second magnetic layer.

3. A semiconductor device according to claim 1, wherein the third thin film layer has a thickness of 2.25 nanometers or less.

4. A semiconductor device according to claim 1, wherein the third thin film layer comprises Pd or Ru.

5. A semiconductor device according to claim 4, wherein the third thin film layer comprises a Pd film or an Ru film at least in an end surface on the second magnetic layer side.

6. A semiconductor device according to claim 1,
wherein the first magnetic layer comprises a Co film and an Ni film, and
wherein the second magnetic layer comprises a Co film and a Pt film.

7. A semiconductor device according to claim 1, wherein the first magnetic layer and the second magnetic layer have planar shapes different from each other.

8. A semiconductor device according to claim 1, further comprising a magnetic tunnel junction element for reading information from an information recording portion, the information recording portion comprising at least the first magnetic layer and the second magnetic layer.

9. A semiconductor device according to claim 2, wherein the third thin film layer has a thickness of 2.25 nanometers or less.

* * * * *